(12) United States Patent
Cho et al.

(10) Patent No.: US 8,164,491 B2
(45) Date of Patent: Apr. 24, 2012

(54) COEFFICIENT MULTIPLIER AND DIGITAL DELTA-SIGMA MODULATOR USING THE SAME

(75) Inventors: Min Hyung Cho, Daejeon (KR); Yi Gyeong Kim, Daejeon (KR); Jong Kee Kwon, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 87 days.

(21) Appl. No.: 12/783,294

(22) Filed: May 19, 2010

(65) Prior Publication Data

US 2011/0140940 A1    Jun. 16, 2011

(30) Foreign Application Priority Data

Dec. 15, 2009  (KR) .................. 10-2009-0124438

(51) Int. Cl.
*H03M 7/32*  (2006.01)
(52) U.S. Cl. .......... 341/77; 375/298; 327/357; 327/359; 708/319; 708/620
(58) Field of Classification Search ............. 341/77–90; 375/298; 327/357, 359, 553, 524, 552; 708/620, 708/835, 319
See application file for complete search history.

(56) References Cited

U.S. PATENT DOCUMENTS

| | | | | |
|---|---|---|---|---|
| 5,726,599 A * | 3/1998 | Genest | ........................... | 327/553 |
| 6,377,968 B1 * | 4/2002 | Nakase et al. | ................ | 708/319 |
| 6,940,920 B2 * | 9/2005 | Sevenhans et al. | ........... | 375/298 |
| 7,053,688 B2 * | 5/2006 | Mukherjee et al. | ........... | 327/359 |
| 7,119,846 B2 * | 10/2006 | Someya | ........................ | 348/441 |
| 7,254,598 B2 * | 8/2007 | Yomo et al. | ................... | 708/319 |
| 7,389,932 B1 * | 6/2008 | Roquemore et al. | ..... | 235/462.43 |
| 2007/0276892 A1 * | 11/2007 | Yomo et al. | ................... | 708/301 |

FOREIGN PATENT DOCUMENTS

| | | |
|---|---|---|
| JP | 2006-229921 A | 8/2006 |
| KR | 1020010053625 A | 6/2001 |
| KR | 1020080040458 A | 5/2008 |

OTHER PUBLICATIONS

Reid M. Hewlitt et al., "Canonical Signed Digit Representation for Fir Digital Filters," IEEE, 2000, pp. 416-426, 2000 IEEE.

* cited by examiner

*Primary Examiner* — Lam T Mai

(57) ABSTRACT

Provided are a coefficient multiplier and digital delta-sigma modulator using the same. The coefficient multiplier has the average of output signals of respective dependent multipliers as an effective coefficient using a coefficient averaging technique without employing an adder that has a complex structure and occupies a large chip area. Accordingly, the coefficient multiplier has a simple hardware constitution and small chip area in comparison with a canonical signed digit (CSD) coefficient multiplier, and the digital delta-sigma modulator employing the coefficient multiplier has a simple structure and small size.

6 Claims, 6 Drawing Sheets

COEFFICIENT MULTIPLIER AND DIGITAL DELTA-SIGMA MODULATOR USING THE SAME

CROSS-REFERENCE TO RELATED APPLICATION

This application claims priority to and the benefit of Korean Patent Application No. 10-2009-0124438, filed Dec. 15, 2009, the disclosure of which is incorporated herein by reference in its entirety.

BACKGROUND

1. Field of the Invention

The present invention relates to a coefficient multiplier and digital delta-sigma modulator using the same, and more particularly to technology for implementing a coefficient multiplier with a new structure based on a coefficient averaging technique to have a simple hardware constitution and occupy a small chip area in comparison with a coefficient multiplier based on canonical signed digit (CSD) representation.

2. Discussion of Related Art

Digital delta-sigma modulators convert a high-resolution input signal into a low-resolution output signal, include high-resolution information in the output signal through oversampling in return, and output the output signal.

In the chip of such a digital delta-sigma modulator, a digital circuit occupies a considerably larger area than an analog circuit. Since the analog circuit requires a low degree of precision, digital delta-sigma modulators are widely used in low voltage/low power application fields.

FIG. 1 is a block diagram of a conventional third-order digital delta-sigma modulator.

Referring to FIG. 1, the conventional third-order digital delta-sigma modulator includes eleven coefficient multipliers 100, four adders 200, three accumulators 300, and one quantizer 400.

In the digital delta-sigma modulator having the above-mentioned constitution, the coefficient multipliers 100 have a larger number than the adders 200 and the accumulators 300. Also, the coefficient multipliers 100 have a much more complex circuit constitution and much larger chip size than the other components.

In other words, it can be understood that the complexity and chip size of a digital delta-sigma modulator are dependent on the complexity and size of coefficient multipliers.

In general, a general-purpose coefficient multiplier has a complex circuit structure, and occupies a significantly large area when it is implemented as a chip. For this reason, to reduce hardware complexity and a chip size, digital delta-sigma modulators are frequently implemented using a CSD coefficient multiplier instead of a general-purpose coefficient multiplier.

In CSD representation, a coefficient of a multiplier having a constant value is represented as a sum of powers of two. A CSD coefficient multiplier will be described in brief below.

FIG. 2 is a block diagram of a CSD coefficient multiplier 100, and FIG. 3 illustrates a shifter 110 shown in FIG. 2.

As shown in FIG. 2, the CSD coefficient multiplier 100 can be implemented by only shifters 110 and adders 130 due to a coefficient represented as a sum of powers of two. As shown in FIG. 3, the shifter 110 is simply implemented by directly connecting buffers 120.

However, even if a digital delta-sigma modulator is implemented using the CSD coefficient multiplier 100, the coefficient multiplier 100 is still the most complex and occupies the largest area in the entire structure.

Consequently, to implement a digital delta-sigma modulator having a simple structure and small size, a coefficient multiplier that has a simple hardware constitution and occupies a small chip area is needed.

SUMMARY OF THE INVENTION

The present invention is directed to a coefficient multiplier with a new structure that has a simple hardware constitution and occupies a small chip area in comparison with a conventional canonical signed digit (CSD) coefficient multiplier, and a digital delta-sigma modulator that employs the coefficient multiplier and thus has a simple structure and small size.

One aspect of the present invention provides a coefficient multiplier including: a plurality of dependent multipliers for outputting products of an input signal and coefficients; and a switch for alternately outputting the output products of the dependent multipliers according to a switch control signal.

Another aspect of the present invention provides a digital delta-sigma modulator including: a plurality of coefficient multipliers, a plurality of adders, a plurality of accumulators, and a quantizer. Here, each of the coefficient multipliers includes: a plurality of shifters for outputting products of an input signal and coefficients; and a switch for alternately outputting the output signals of the shifters according to a switch control signal.

Each of the coefficient multipliers may have an average of the output signals output from the switch as an effective coefficient. When a duty of the switch control signal is changed, the average of the output signals output from the switch may be changed, and the effective coefficient may be changed.

Yet another aspect of the present invention provides a coefficient multiplier including: a dependent multiplier in which a plurality of input buffers are respectively connected to a plurality of output buffers through a plurality of switches. Here, the input buffers are respectively shifted by the switches according to a switch control signal, and a coefficient of the dependent multiplier is alternately changed into powers of two.

The coefficient multiplier may have an average of output signals output from the output buffers as an effective coefficient. When a duty of the switch control signal is changed, the average of the output signals output from the output buffers may be changed, and the effective coefficient may be changed.

BRIEF DESCRIPTION OF THE DRAWINGS

The above and other objects, features and advantages of the present invention will become more apparent to those of ordinary skill in the art by describing in detail exemplary embodiments thereof with reference to the attached drawings, in which.

DETAILED DESCRIPTION OF EXEMPLARY EMBODIMENTS

Hereinafter, exemplary embodiments of the present invention will be described in detail. However, the present invention is not limited to the embodiments disclosed below but can be implemented in various forms. The following embodiments are described in order to enable those of ordinary skill in the art to embody and practice the present invention. To clearly describe the present invention, parts not relating to the description are omitted from the drawings. Like numerals refer to like elements throughout the description of the drawings.

For convenience, the structure of a coefficient multiplier according to an exemplary embodiment of the present invention will be described in comparison with the structure of a conventional canonical signed digit (CSD) coefficient multiplier.

Figure 1:
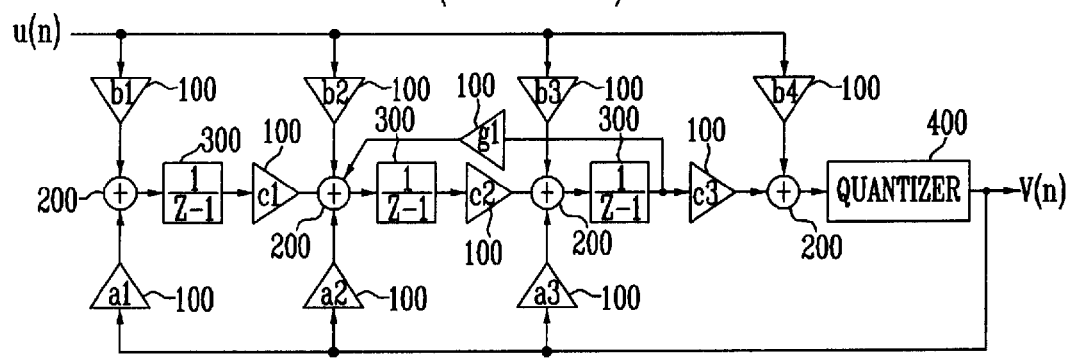
FIG. 1 is a block diagram of a conventional third-order digital delta-sigma modulator.
Figure 2:
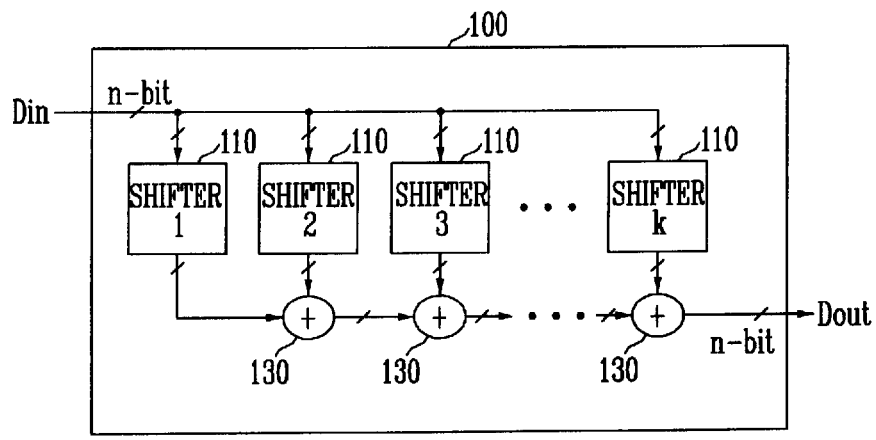
FIG. 2 is a block diagram of a canonical signed digit (CSD) coefficient multiplier.
Figure 3:
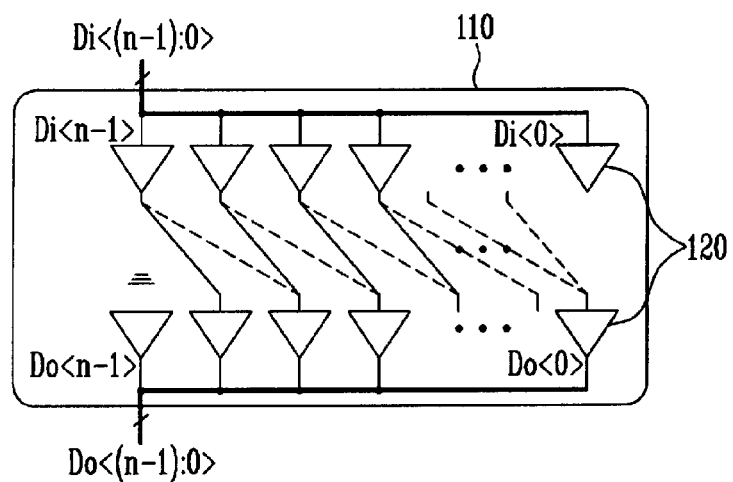
FIG. 3 illustrates a shifter shown in FIG. 2.
Figure 4:
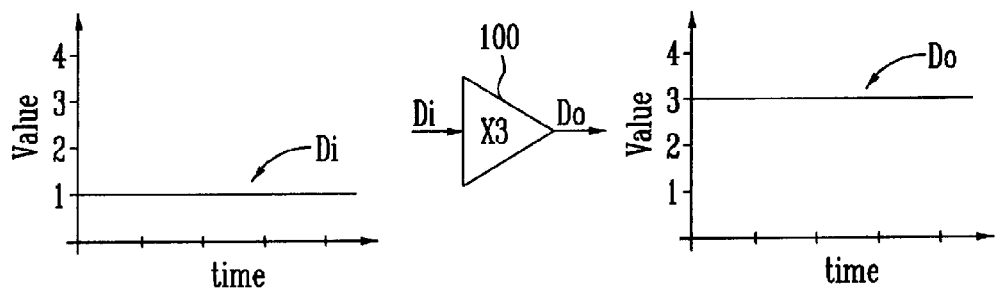
FIG. 4 illustrates the basic operation of a conventional coefficient multiplier.

FIG. 4 shows values of input and output signals of a conventional coefficient multiplier 100 having a coefficient "3" to describe the basic operation of the coefficient multiplier 100.

Figure 5:
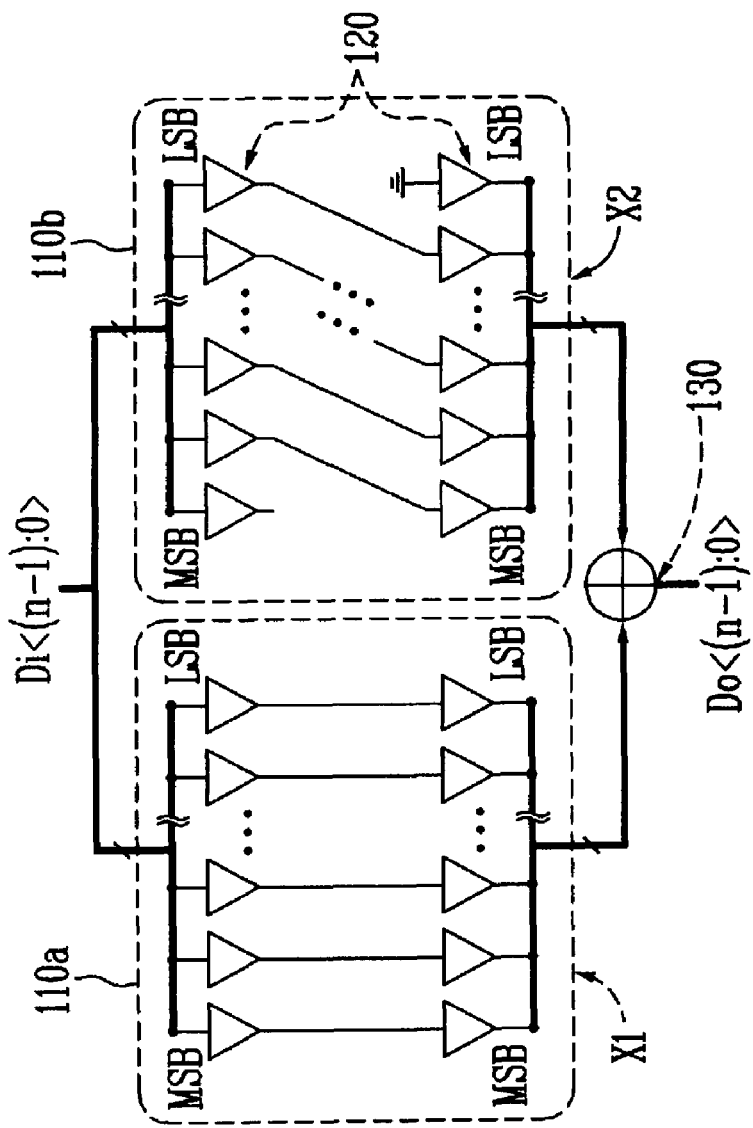
FIG. 5 illustrates the conventional coefficient multiplier of FIG. 4 according to CSD representation, and the same implemented as hardware.
Figure 5:
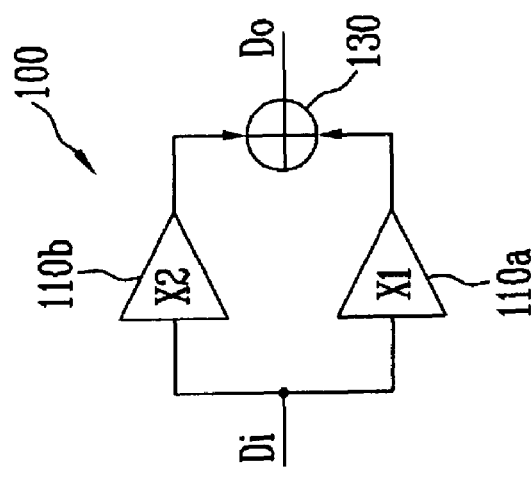

Referring to FIG. 4, the conventional coefficient multiplier 100 outputs an output signal Do obtained by multiplying an input signal Di by the coefficient "3." In FIG. 5, the coefficient multiplier 100 is illustrated according to CSD representation and implemented as hardware.

FIG. 5 illustrates the conventional coefficient multiplier 100 of FIG. 4 according to CSD representation, and the same implemented as hardware.

Referring to FIG. 5, the conventional CSD coefficient multiplier 100 includes a first n-bit multiplier 110a having a coefficient "$2^0(=1)$," a second n-bit multiplier 110b having a coefficient "$2^1$," and an n-bit adder 130 for adding output signals of the first and second multipliers 110a and 110b. The CSD coefficient multiplier 100 is implemented by directly connecting input and output buffers 120.

However, the word lengths of the input and output signals Di and Do of the coefficient multiplier 100 are long, and thus the adder 130 has a complex structure and occupies a large area in a chip.

In other words, the CSD coefficient multiplier 100 still includes the adder 130 that has a more complex structure and occupies a larger chip area than the other blocks.

To solve this problem, an exemplary embodiment of the present invention suggests a coefficient multiplier with a new structure that does not employ an adder having a complex structure and occupying a large chip area but has an average of output signals as an effective coefficient using a coefficient averaging technique.

In other words, since a coefficient multiplier according to an exemplary embodiment of the present invention does not employ an adder, it has a simple hardware constitution and occupies a small chip area in comparison with a conventional coefficient multiplier. These structural characteristics will be described in detail below.

Figure 6:
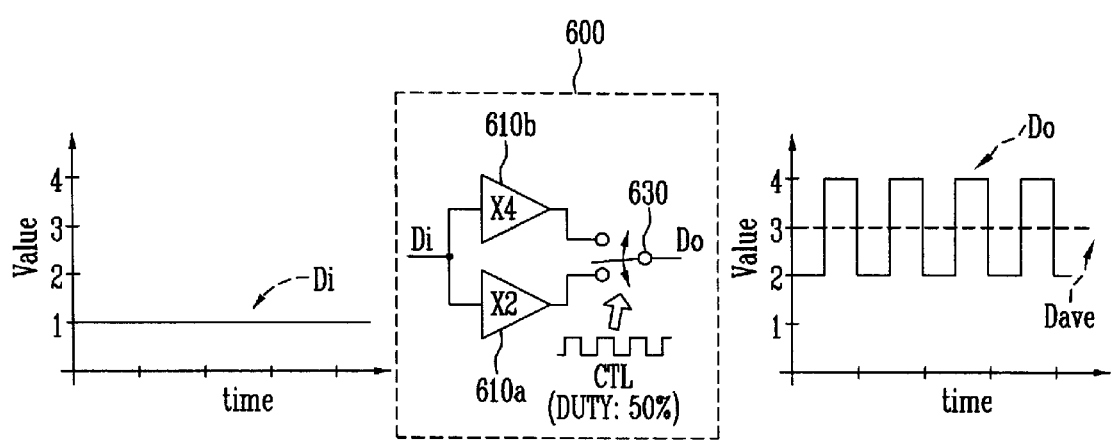
FIG. 6 illustrates the constitution and basic operation of a coefficient multiplier according to an exemplary embodiment of the present invention.

FIG. 6 illustrates the constitution and basic operation of a coefficient multiplier 600 having a coefficient "3" according to an exemplary embodiment of the present invention.

Referring to FIG. 6, the coefficient multiplier 600 according to an exemplary embodiment of the present invention includes a first dependent multiplier 610a having a coefficient "$2^1$," a second dependent multiplier 610b having a coefficient "$2^2(=4)$," and a switch 630 for alternately outputting output signals of the first and second dependent multipliers 610a and 610b according to a switch control signal CTL.

When the duty of the switch control signal CTL is 50%, a final output signal Do alternately has values "2" and "4" as illustrated in FIG. 6.

However, since a digital delta-sigma modulator averages output signals through oversampling to obtain high-resolution information, "3" that is a final average Dave of the final output signal Do becomes the effective output value of the coefficient multiplier 600 according to the averaging characteristic.

Figure 7:
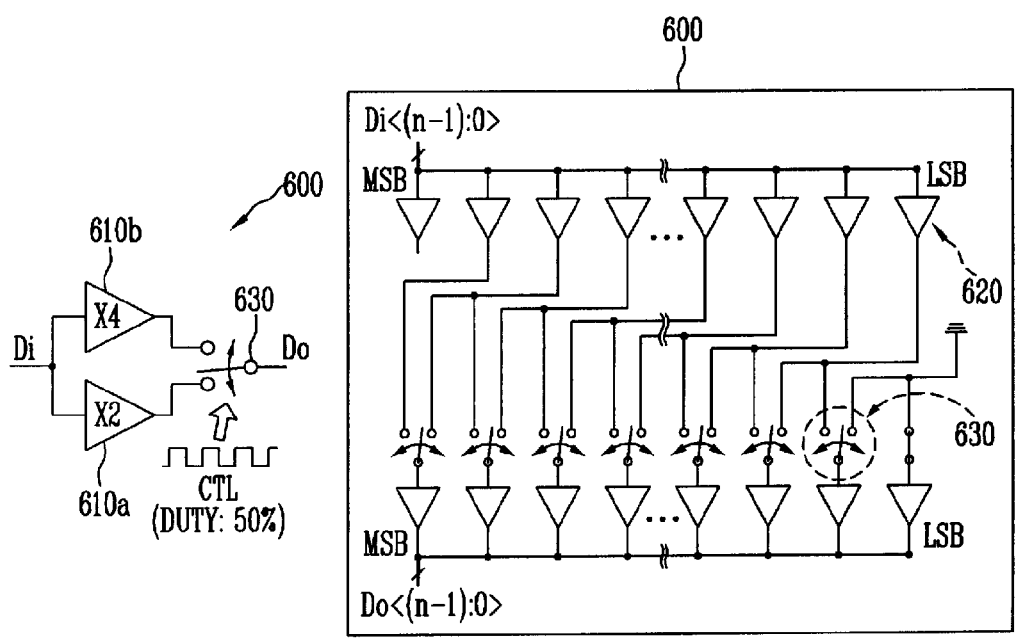
FIG. 7 illustrates a coefficient multiplier implemented as hardware according to an exemplary embodiment of the present invention.

The coefficient multiplier 600 based on the coefficient averaging technique is implemented as hardware as shown in FIG. 7.

FIG. 7 illustrates the coefficient multiplier 600 implemented as hardware according to an exemplary embodiment of the present invention.

Referring to FIG. 7, the coefficient multiplier 600 according to an exemplary embodiment of the present invention does not have an adder that occupies the largest area, unlike the CSD coefficient multiplier 100 shown in FIG. 5.

Instead of an adder, a plurality of switches 630 that are switched according to the switch control signal CTL are added, which will be described in detail below.

n input buffers 620 are shifted to the left by one bit or two bits by the switches 630 according to the switch control signal CTL and respectively connected to n output buffers 620.

When the input buffers 620 are shifted to the left by one bit, the coefficient multiplier 600 operates as the first dependent multiplier 610a having a coefficient "2." When the input buffers 620 are shifted to the left by two bits, the coefficient multiplier 600 operates as the second dependent multiplier 610b having a coefficient "4."

In other words, when the first and second dependent multipliers 610a and 610b have coefficients represented as powers of two, the switches 630 can cause only one dependent multiplier to alternately have coefficients "2" and "4." Thus, it is possible to obtain the same output signal Do as in the case where the output signals of the first and second dependent multipliers 610a and 610b are alternately output.

In FIG. 5, each of the two multipliers 110a and 110b consists of 2*n buffers 120, and 2*(2*n) buffers 120 are needed in total. On the other hand, in FIG. 7, the coefficient multiplier 600 can be implemented by only one dependent multiplier, and only 2*n buffers 620 are needed. In other words, the number of the buffers 620 is reduced by half.

Meanwhile, when the switches 630 are implemented as hardware, they can have a similar or smaller size than the buffers 620.

Consequently, the coefficient multiplier 600 according to an exemplary embodiment of the present invention has a simple hardware constitution and occupies a small chip area in comparison with the conventional coefficient multiplier 100 shown in FIG. 5.

Figure 8:
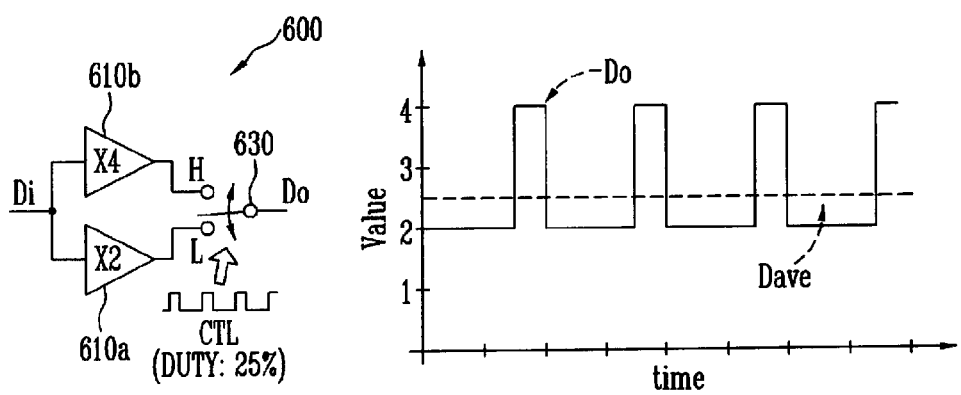
FIG. 8 illustrates a change in output signal according to the duty of a switch control signal in a coefficient multiplier according to an exemplary embodiment of the present invention.

FIG. 8 illustrates a change in output signal according to the duty of the switch control signal CTL in the coefficient multiplier 600 according to an exemplary embodiment of the present invention.

As illustrated in FIG. 8, when the duty of the switch control signal CTL is changed from 50% to 25% with the hardware structure of the coefficient multiplier 600 according to an exemplary embodiment of the present invention unchanged, the final average Dave of the final output signal Do becomes 2.5.

In other words, the coefficient multiplier 600 according to an exemplary embodiment of the present invention can simply change an effective coefficient by changing the duty of the switch control signal CTL.

Figure 9:
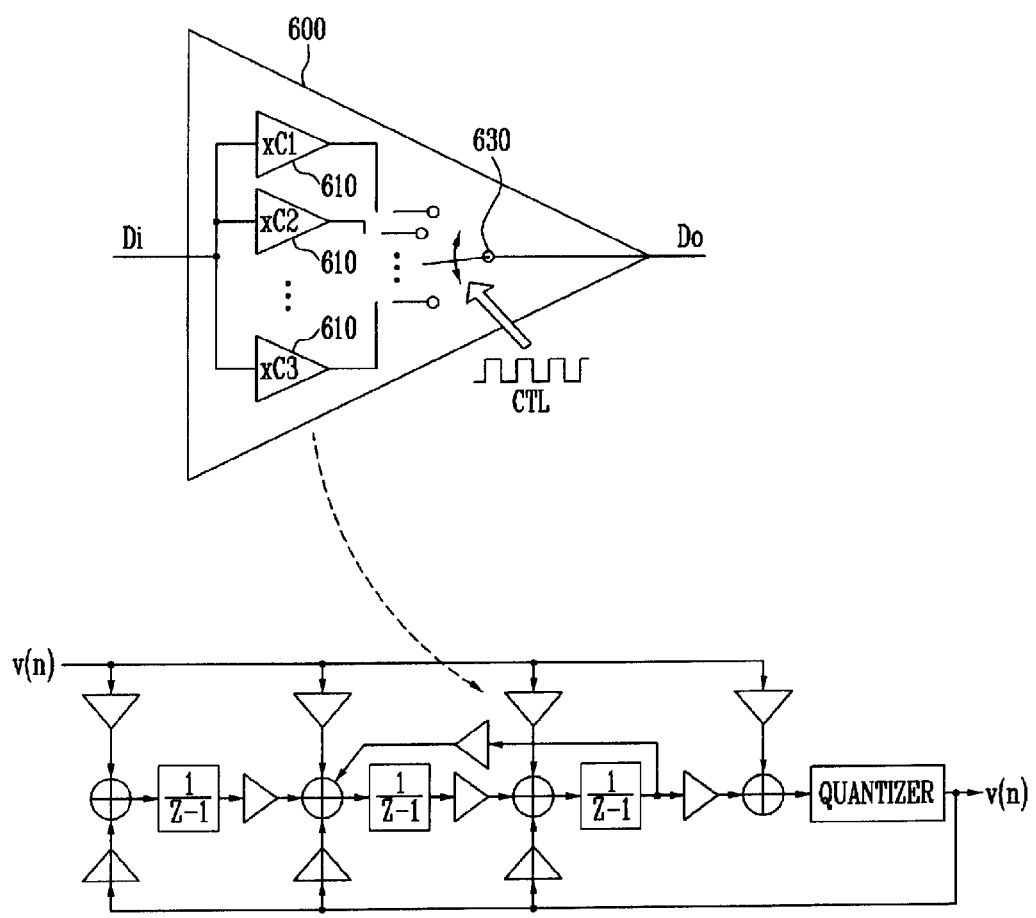
FIG. 9 shows a general constitution of a coefficient multiplier according to an exemplary embodiment of the present invention, and a digital delta-sigma modulator employing the coefficient multiplier.

FIG. 9 shows a general constitution of the coefficient multiplier 600 according to an exemplary embodiment of the present invention, and a digital delta-sigma modulator employing the coefficient multiplier 600.

As illustrated in FIG. 9, the coefficient multiplier 600 according to an exemplary embodiment of the present invention includes a switch 630 for alternately outputting output signals of respective dependent multipliers 610 instead of an adder that has a complex structure and occupies a large area.

Consequently, the digital delta-sigma modulator implemented using the coefficient multiplier 600 according to an exemplary embodiment of the present invention has higher chip area efficiency than a digital delta-sigma modulator implemented using a conventional coefficient multiplier.

According to exemplary embodiments of the present invention, it is possible to implement a coefficient multiplier that has a simple hardware constitution and occupies a small chip area in comparison with a conventional CSD coefficient multiplier, and a digital delta-sigma modulator that employs the coefficient multiplier and thus has a simple structure and small size.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. A coefficient multiplier, comprising:
   a plurality of dependent multipliers for outputting products of an input signal and coefficients; and
   a switch for alternately outputting the output products of the dependent multipliers according to a switch control signal,
   wherein an average of an output signal output from the switch is an effective coefficient.

2. The coefficient multiplier of claim 1, wherein when a duty of the switch control signal is changed, the average of the output signal output from the switch is changed, and the effective coefficient is changed.

3. A coefficient multiplier, comprising:
   a dependent multiplier in which a plurality of input buffers are respectively connected to a plurality of output buffers through a plurality of switches, wherein the input buffers are respectively shifted by the switches according to a switch control signal, and a coefficient of the dependent multiplier is alternately changed into powers of two, and
   wherein an average of output signals output from the output buffers is an effective coefficient.

4. The coefficient multiplier of claim 3, wherein when a duty of the switch control signal is changed, the average of the output signals output from the output buffers is changed, and the effective coefficient is changed.

5. A digital delta-sigma modulator comprising:
   a plurality of coefficient multipliers;
   a plurality of adders;
   a plurality of accumulators; and
   a quantizer,
   wherein each of the coefficient multipliers comprising:
      a plurality of dependent multipliers for outputting products of an input signal and coefficients; and
      a switch for alternately outputting the output products of the dependent multipliers according to a switch control signal,
      wherein the coefficient multiplier has an average of an output signal output from the switch as an effective coefficient.

6. The digital delta-sigma modulator of claim 5, wherein when a duty of the switch control signal is changed, the average of the output signal output from the switch of the coefficient multiplier is changed, and the effective coefficient of the coefficient multiplier is changed.

* * * * *